(12) United States Patent
Alphonse

(10) Patent No.: US 6,184,542 B1
(45) Date of Patent: Feb. 6, 2001

(54) SUPERLUMINESCENT DIODE AND OPTICAL AMPLIFIER WITH EXTENDED BANDWIDTH

(75) Inventor: Gerard A. Alphonse, Princeton, NJ (US)

(73) Assignee: Princeton Lightwave, Princeton, NJ (US)

( * ) Notice: Under 35 U.S.C. 154(b), the term of this patent shall be extended for 0 days.

(21) Appl. No.: 09/159,148

(22) Filed: Sep. 23, 1998

Related U.S. Application Data

(60) Provisional application No. 60/089,414, filed on Jun. 16, 1998.

(51) Int. Cl.[7] .................................................. H01L 33/00
(52) U.S. Cl. .............................................................. 257/94
(58) Field of Search ................................ 257/13, 94, 102, 257/103

(56) References Cited

U.S. PATENT DOCUMENTS

| | | |
|---|---|---|
| 4,821,277 | 4/1989 | Alphonse et al. ..................... 372/45 |
| 4,901,123 | 2/1990 | Noguchi et al. ....................... 357/17 |
| 5,008,889 | 4/1991 | Wilson .................................. 372/32 |
| 5,223,722 | 6/1993 | Nagai et al. ........................... 257/96 |
| 5,357,124 | 10/1994 | Kajiwara et al. ..................... 257/95 |
| 5,689,358 | * 11/1997 | Nakao et al. ......................... 359/248 |

OTHER PUBLICATIONS

Noguchi et al., "Functional InGaAsP/InP Superluminescent Diodes", Institute of Lectronics, Information an Communication ENgineers, OQE 91–93, pp. 37–42, Sep. 1991.*

* cited by examiner

Primary Examiner—Olik Chaudhuri
Assistant Examiner—Douglas A. Willie

(57) ABSTRACT

A superluminescent diode having emission layers which emit different wavelengths of light disposed side-by-side whereby light emitting in a first direction from an emission layer having a longer wavelength than an adjacent layer in the first direction is not absorbed. Thus, light of the different wavelengths is represented in an output spectra in the first direction at a point beyond the adjacent layer. A semiconductor optical amplifier is formed by creating a symmetrical structure in which the longest wavelength material is grown in the center and the shortest wavelength material is grown near the facets.

8 Claims, 7 Drawing Sheets

SUPERLUMINESCENT DIODE AND OPTICAL AMPLIFIER WITH EXTENDED BANDWIDTH

This application claims the benefit of U.S. Provisional Application No. 60/089,414, filed Jun. 16, 1998.

BACKGROUND OF THE INVENTION

1. Field of the Invention

The present invention relates to a superluminescent diode, and more particularly, to a very broad band superluminescent diode obtained by growing in series two or more active layers along the length of an active waveguide and the application of such a superluminescent diode as an optical amplifier.

2. Description of the Prior Art

A superluminescent diode (SLD) is a diode in which there is stimulated emission with amplification, but insufficient feedback for oscillations to build up to achieve lasing action. SLDs are made by the same processes as laser diodes, and like laser diodes, can be fabricated to operate at various wavelengths such as 835 nm, 960 nm, 1300 nm, and 1550 nm. SLDs are used as light sources in applications such as fiber optic gyroscopes, fiber optic sensors, optical coherence tomography (OCT), and communications.

SLDs offer higher power output as compared to conventional light emitting diodes (LEDs), and offer broader spectral range (lower coherence) than lasers. The broadband width is similar to but not as wide as an LED, but the output power is as high as that of a semiconductor laser. Thus, SLDs can emit low coherent light at high output power with good directionality. In designing and producing high power SLDs, it is important to prevent laser oscillation in order for the output light to be the amplified spontaneous emission spectrum.

The full width half maximum (FWHM) bandwidth $\Delta\lambda$ of SLDs is on the order of about 2.0 to about 2.5% of the peak emission wavelength of the active layers. Thus, a 1550 nm SLD would have a FWHM output spectrum of about 35 nm. Wavelength division multiplex (WDM) communication systems, in which several laser wavelengths are used as carriers in optical communications systems, require much larger bandwidths, typically on the order of 100 nm. The same is true with OCT systems that are under development for medical imaging and diagnostics instruments which require light sources with short coherence length for high depth resolution (resolving features over depths of a few microns). The coherence length is inversely proportional to the bandwidth; hence, the broader the SLD bandwidth, the shorter the coherence length, and the higher the resolution of OCT systems. It is thus desired to develop very large bandwidth SLDs.

A semiconductor laser diode structure, which is the basis of an SLD, generally consists of one or more active layers sandwiched between n-doped and p-doped cladding layers, all deposited on a single crystal substrate. In modern devices, the layers are very thin layers called quantum well (QW) layers, and they are typically deposited by MOCVD (metal organic chemical vapor deposition). The emission wavelength is determined by the thickness, composition, and strain of the active layer. A highly doped capping layer, such as a p-doped layer, is deposited over the device to facilitate contact with electrodes supplying the drive current. The bottom of the substrate is also processed with a conductor, such as n-doped metal, in order to facilitate contact and to enable current injection. An optical waveguide is created in the structure by evaporating a dielectric on the p-side in which a narrow stripe is removed for metal contact by means of evaporated metal layers on top of the dielectric. The device is completed by cleaving it into small bars or chips.

FIG. 1(a) shows a prior art ridge waveguide laser structure. An n type cladding layer 3 is deposited on a substrate 2. An undoped active layer 4 is deposited on the n type cladding layer 3. A p type cladding layer 5 is deposited on the undoped active layer 4. It is preferable that the refractive index of the undoped active layer 4 is greater than the refractive index of the two cladding layers 3, 5. The cladding layer 5 typically comprises a first cladding layer and a second cladding layer separated by an etch stop layer (not shown).

A capping layer 6 is deposited on the p type cladding layer 5. After the capping layer 6 is deposited, photolithography and etching is performed to define the waveguide as a ridge 8 with channels 9 on the sides. The channels are patterned and the capping layer 6 and the cladding layer 5 are etched down to the etch stop layer. Thus, in the channels, a small portion of the cladding layer 5 overlies the undoped active layer 4. An electrical contact 1 is then deposited to overlie the surface of the substrate 2 opposite the n type cladding layer 3. The electrical contact 1 preferably comprises at least one of germanium, gold, and nickel. A dielectric is then deposited over the entire top surface of the structure. Using photolithography and etching, a stripe is opened over the ridge 8, and a metal is deposited therein on the capping layer 6 as a second electrical contact 7 in the stripe region. Thus, current will flow only in the ridge region. The second contact comprises at least one of titanium, platinum, and gold.

A laser is made by processing the contact stripe so that it is perpendicular to the cleaved facets a and b in order to form a cavity using the facet reflections R1 and R2, as shown in the ASE (amplified spontaneous emission) region in FIG. 1(b). Because of the cavity action, the output spectrum of the laser is very narrow, as shown in FIG. 1(c). An SLD is made by fabricating the waveguide stripe of FIG. 1(b) at an angle $\theta$ with respect to the facets a and b to avoid facet reflection, as shown in FIGS. 2(a) and 2(b). The output spectrum of the SLD is broad, as shown in FIG. 2(c).

It is difficult to broaden the SLD output spectrum beyond the natural width shown in FIG. 2(c). One structure that has been proposed to broaden the spectrum is to stack or stagger QW layers of different thickness and composition within the active layer structure, each layer having a slightly different emission wavelength. An example of such an SLD is the layer stack shown in FIG. 3(a) and comprises three layers of materials or three groups of QW layers having respective center emission wavelengths $\lambda 1$, $\lambda 2$, and $\lambda 3$ and FWHM of $\Delta\lambda 1$, $\Delta\lambda 2$, and $\Delta\lambda 3$, respectively. The three layers or groups of layers of materials in the stack can be separated by buffering materials. This stack approach has been tried, but it does not produce the desired results because the material having the longer wavelength absorbs the light emitted by the material(s) having the shorter wavelength(s). For example, in FIG. 3(a), $\lambda 1 > \lambda 2 > \lambda 3$, then both $\lambda 2$ and $\lambda 3$ are absorbed by the $\lambda 1$ material to emit more light centered at $\lambda 1$, with the result that the output spectrum $\Delta\lambda$ is essentially the same as that of the $\lambda 1$ material, as shown in FIG. 3(b).

Although the art of superluminescent diodes is well developed, there remain some problems inherent in this technology, particularly with respect to the bandwidth of the output spectrum. Therefore, a need exists for an SLD having a broadened output spectrum and that overcomes the drawbacks of the prior art. The present invention has been developed for this purpose.

SUMMARY OF THE INVENTION

The present invention is directed to a superluminescent diode comprising a first conductivity type substrate and a structure comprising a first conductivity type first cladding layer, an active layer, and a second conductivity type cladding layer successively disposed on the substrate. The active layer has a first emission layer having a first light emission wavelength and a second or more emission layers having light emission wavelengths that are different from the first light emission wavelength. The first, second and any other emission layers are disposed side-by-side so that light emitted from the first emission layer in a first direction is not substantially absorbed by the second and any other emission layers. The structure has opposed first and second facets transverse to the layers with the active layer extending between the facets. The structure is arranged to form an optical beam path extending between the facets to direct light emitted from the first and second emission layers.

BRIEF DESCRIPTION OF THE DRAWINGS

The present invention will be better understood after reading the following detailed description of the presently preferred embodiments thereof with reference to the appended drawings, in which.

DETAILED DESCRIPTION OF THE PREFERRED EMBODIMENTS

A system and method which meets the above-mentioned objects and provides other beneficial features in accordance with the presently preferred exemplary embodiment of the invention will be described below with reference to FIGS. 4 through 6. Those skilled in the art will readily appreciate that the description given herein with respect to those figures is for explanatory purposes only and is not intended in any way to limit the scope of the invention.

Figure 1A:
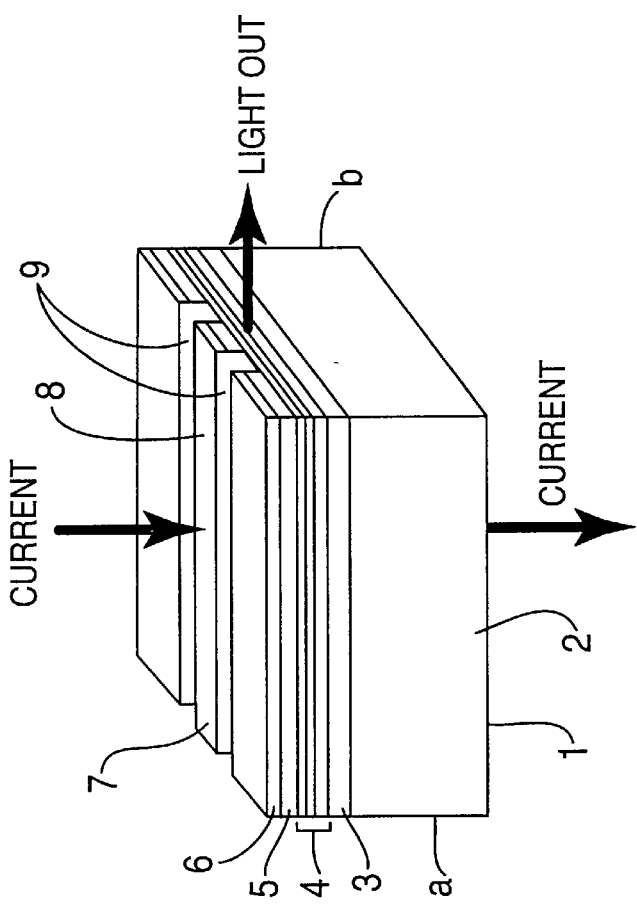
FIGS. 1(a) and 1(b) illustrate a side perspective view and a top view, respectively, of a prior art semiconductor laser having the narrow output spectrum of FIG. 1(c).
Figure 1B:
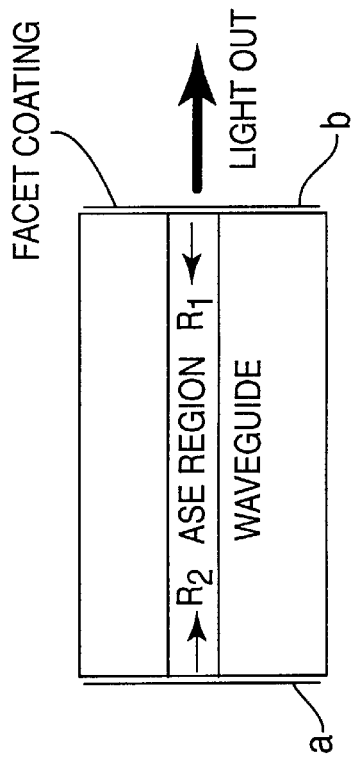
Figure 1C:
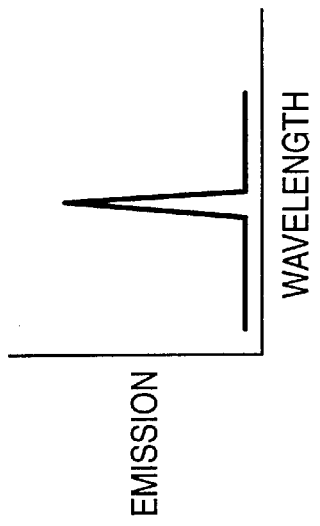
Figure 2B:
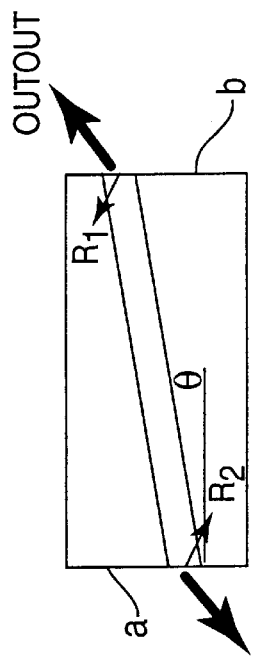
FIGS. 2(a) and 2(b) illustrate a side perspective view and a top view, respectively, of a prior art angled superluminescent diode having the broad output spectrum of FIG. 2(c).
Figure 2C:
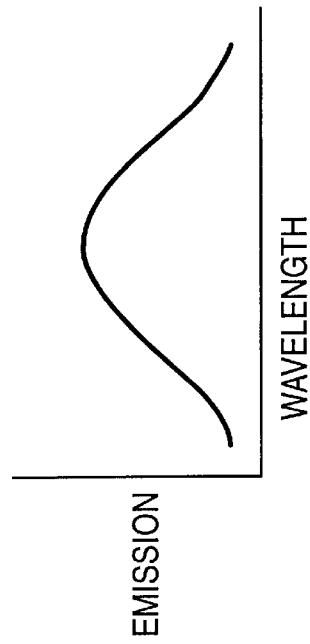
Figure 2A:
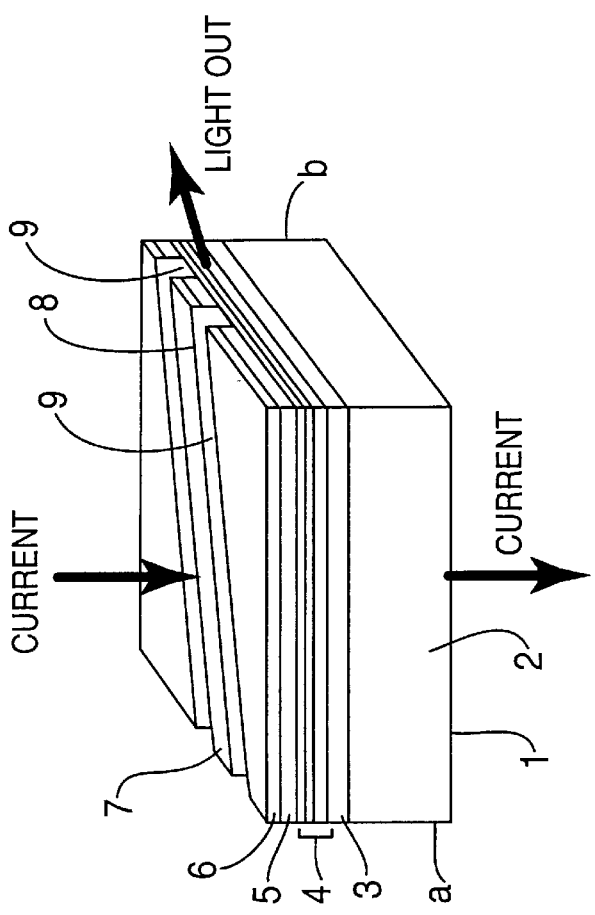
Figure 3A:
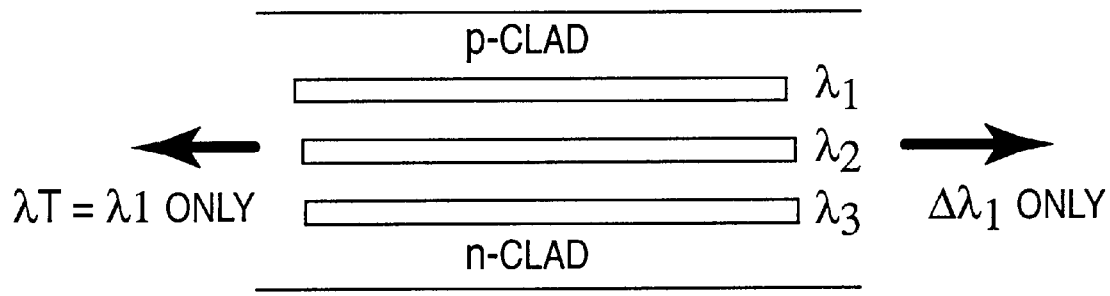
FIG. 3(a) illustrates a prior art structure having stacked or staggered quantum well layers of different thickness and composition within the layer structure, each layer having a different emission wavelength.
Figure 3B:
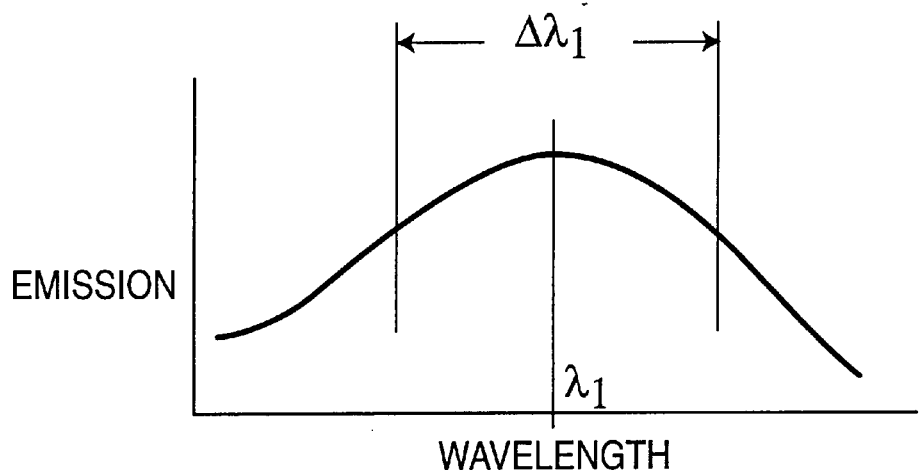
FIG. 3(b) illustrates the output spectrum of the structure of FIG. 3(a).
Figure 4B:
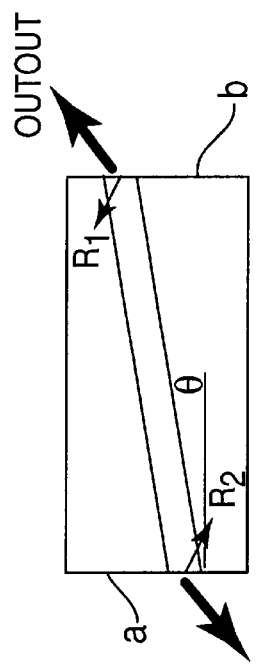
FIGS. 4(a) and 4(b) illustrate a side perspective view and top view, respectively, of an exemplary superluminescent diode in accordance with the present invention.
Figure 4A:
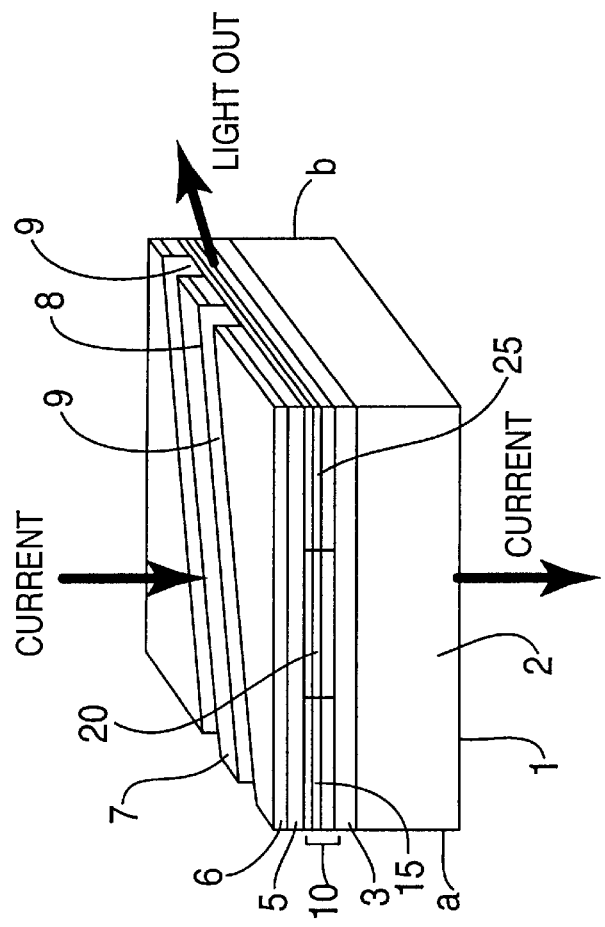

FIG. 4(a) illustrates an exemplary waveguide having emission layers grown or deposited in tandem or series in accordance with the present invention, in which the material having long wavelength emissions is prevented from absorbing the light emissions of the material having short wavelength emissions. FIG. 4(a) contains elements similar to those described above with respect to FIGS. 1(a) and 2(a). These elements are labeled identically and their description is omitted for brevity.

The exemplary structure is similar to a conventional SLD as described above with respect to FIG. 2(a), except that the active layer 10 comprises three emission layers or materials 15, 20, and 25, in series preferably throughout the entire active layer 10. Each material 15, 20, and 25 has a different center emission wavelength, $\lambda 1$, $\lambda 2$, and $\lambda 3$, respectively. It should be noted, however, that any number of emission layers can be used in accordance with the present invention. The active emission layers are sandwiched between the n-cladding layer 3 and the p-cladding layer 5.

Figure 4C:
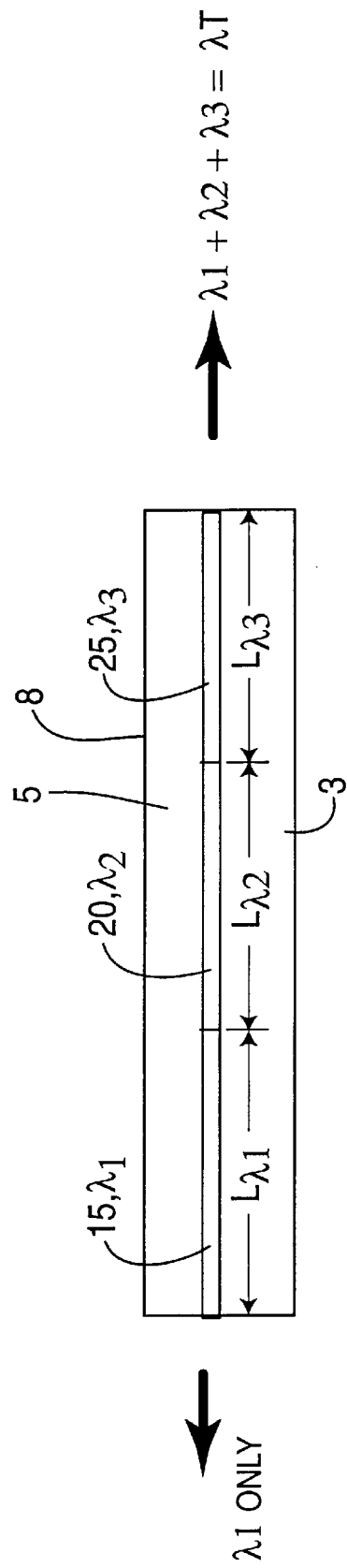
FIG. 4(c) illustrates an exemplary tandem configuration of emission layers for extending the bandwidth of the superluminescent diode of FIG. 4(a).

A cross-section of the cladding layers 3, 5 and the active layer 10 along the ridge 8 of the device is shown in FIG. 4(c), in the direction that the light travels. The layers 15, 20, 25 can be directly neighboring each other, as shown, or separated by the overlying cladding layer.

Referring to FIG. 4(a), the device is typically composed of binary group III-V compounds such as GaAs, InP, and alloys of such compounds. For operation in the approximately 800 to 980 nm range, the substrate 2 is typically composed of n-type GaAs about 100 $\mu$m thick and has a first major surface parallel to or slightly misoriented from the (100) crystallographic plane. The first cladding layer 3 typically combines the functions of a buffer layer and a cladding layer. The cladding layers 3, 5 are typically each about 1.5 $\mu$m thick, and typically comprise $Al_xGa_{1-x}As$ where x is generally between about 0.3 and 0.4, and more typically about 0.4. The active layer 10, which comprises the neighboring emission layers 15, 20, 25, is typically about 0.08 $\mu$m thick and typically comprises $Al_xGa_{1-x}As$ where x is generally between about 0 and 0.1, depending on the wavelength to be emitted. The capping layer 6 is typically about 0.5 $\mu$m thick and typically comprises n or p-type GaAs. For operation in the approximately 1300 to 1600 nm range, the substrate is typically n-type InP and the layers are $In_xGa_{1-x}As_yP_{1-y}$, where x and y are appropriately chosen for the desired wavelength of operation.

The ridge 8 defines an effective optical beam path within the device which is the gain region. The current confining structure extends between the pair of opposed parallel end faces or facets a and b, and has an axis of symmetry which is at an angle $\theta$ relative to the direction perpendicular to the end faces a and b, as shown in FIG. 4(b). Preferably, $\theta$ has a value between about 5 and 10 degrees, and the value can be as high as the critical angle at the facet, which is about 15 degrees.

In operation, a bias voltage of the proper polarity is applied to the electrical contacts to produce light emission in the active region.

In this exemplary structure, light emitted by each material 15, 20, 25 travels both to the left and to the right in the ridge waveguide 8. Referring to FIG. 4(c), for propagation in the left direction, assuming $\lambda 1 > \lambda 2 > \lambda 3$, as light of center wavelength $\lambda 3$ propagates to the left from the $\lambda 3$ material, it is absorbed first by the $\lambda 2$ material 20, and any residual amount is absorbed by the $\lambda 1$ material 15. Similarly, for propagation in the left direction, light of center wavelength $\lambda 2$ is absorbed by the $\lambda 1$ material 15. For propagation in the left direction, light of wavelength $\lambda 1$ is not substantially absorbed by any material and exits the ridge waveguide 8 as light having a wavelength of λ1. Thus, the result of the output spectrum of the light propagating to the left is essentially that of the λ1 material 15.

Figure 4D:
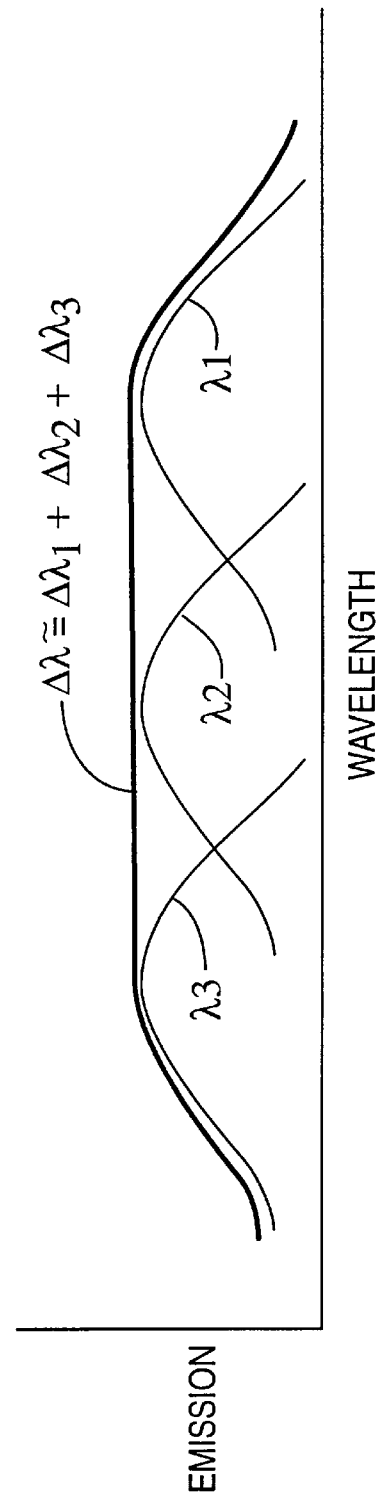
FIG. 4(d) illustrates the output spectrum of the configuration of FIG. 4(c).

However, with regards to propagation to the right of the ridge waveguide 8, the λ2 material 20 does not substantially absorb the light of wavelength λ1, and the λ3 material 25 does not substantially absorb light of wavelength λ1 or λ2, because λ1>λ2>λ3. As a result, all three emission spectra appear in the output at the right of the ridge waveguide 8. The resultant spectrum Δλ is shown in FIG. 4(d), and substantially comprises the sum of the three individual spectra, Δλ1, Δλ2, and Δλ3. Thus, as illustrated in FIG. 4(d), the output spectrum a can be made very large (Δλ1+Δλ2+Δλ3 etc.) by adding emission layers of shorter wavelengths to the right of the structure. In other words, a series of emission layers, each emission layer having a smaller emission wavelength λ than the previous emission layers in the series, results in a broadened output spectrum at one end of the waveguide.

Preferably, each of the materials 15 (λ1), 20 (λ2), and 25 (λ3) of the active region are grown separately, in three different steps, before the p-clad layer 5 is overgrown and the remainder of the structure is processed. Moreover, it is desirable that each of the materials 15, 20, 25 has the same length; i.e., $L_{\lambda 1}=L_{\lambda 2}=L_{\lambda 3}$. The process involves first growing the λ1 material 15 over the whole structure using, for example, MOCVD (metal organic chemical vapor deposition) or MBE (molecular beam epitaxy). Conventional photolithography is then used to mask the λ1 region, and etching is performed with conventional etchants to remove material from the λ2 and λ3 regions, and repeating the process for the λ2 material 20 and the λ3 material 25. Those skilled in the art will appreciate that this technique is not a problem, because multiple regrowth is commonly used in the fabrication of semiconductor laser devices.

Figure 5A:
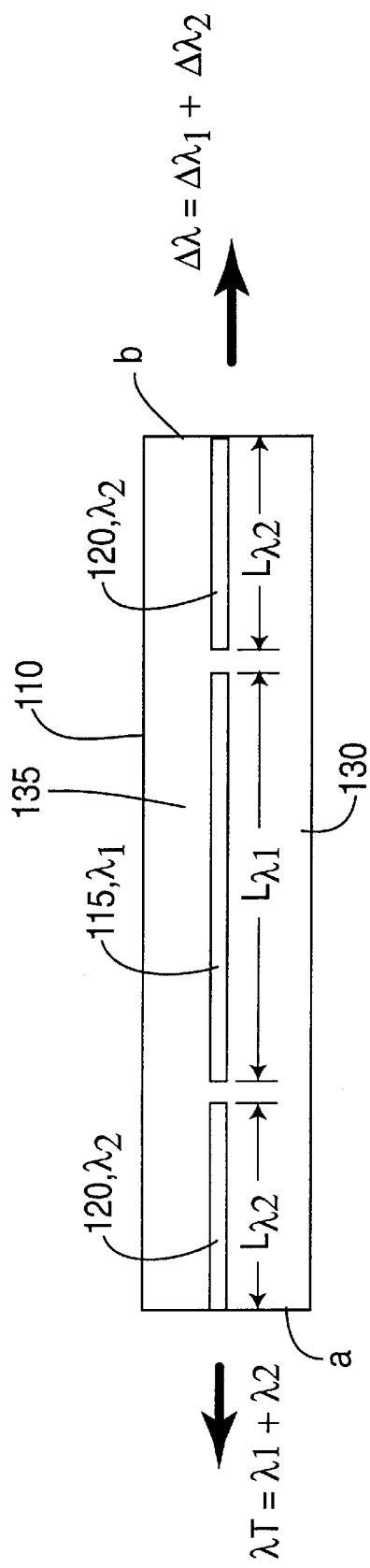
FIG. 5(a) illustrates an exemplary optical amplifier in accordance with the present invention which has the spectra of FIG. 5(b) symmetrically on both the front and rear ends of the waveguide.
Figure 5B:
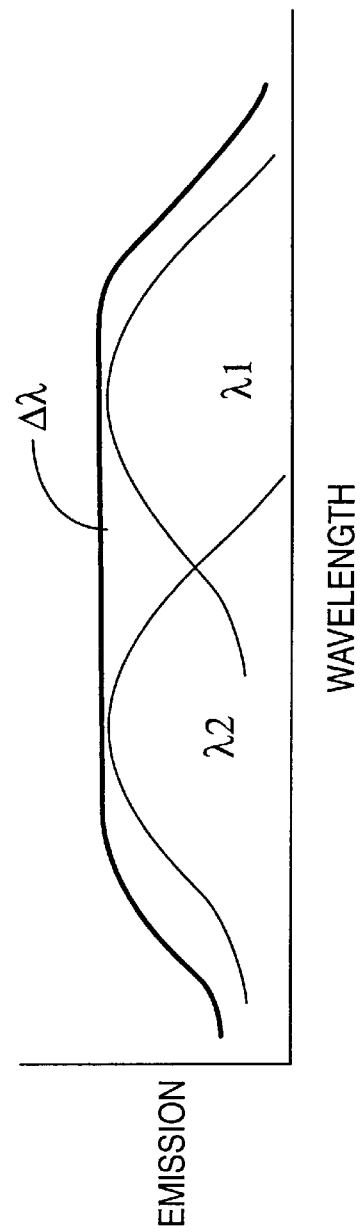

The waveguide of FIG. 4(a) may be modified for use as an optical amplifier by making the spectra from both sides of the waveguide substantially identical. This is accomplished by making the structure of the waveguide symmetrical. FIG. 5(a) illustrates how this is done for two emission layers or materials having emission wavelengths λ1 and λ2, respectively, where λ1>λ2. It should be noted that any number of emission layers or materials can be used in accordance with the present invention. The λ1 material 115 is grown in the center of a waveguide 110, and the λ2 material is grown in two substantially identical sections 120 on either side of the λ1 material 115, closer to the facets a and b, respectively. The materials 115, 120 can either be directly contacting or separated by the overlying cladding layer 135, as shown in FIG. 5(a). Preferably, the length of the center material (the λ1 material 115) is approximately twice the length of each of the side materials (the λ2 material 120); i.e., $L_{\lambda 1}=2L_{\lambda 2}$. The layers of materials 115 and 120 are sandwiched between an n-cladding layer 130 and a p-cladding layer 135. The result is an output spectrum Δλ on both sides of the chip that is the sum of the two spectra (Δλ1+Δλ2) of the two materials 115, 120, as shown in FIG. 5(b). In other words, by centering a layer having a high emission wavelength between two substantially identical layers having a lower emission wavelength, a broadened output spectrum is attained.

Figure 6A:
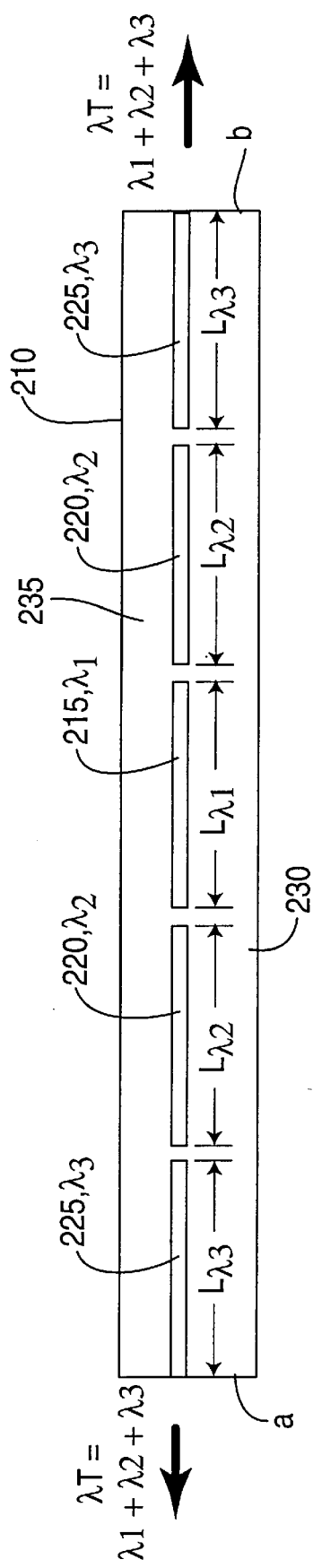
FIG. 6(a) illustrates another exemplary optical amplifier in accordance with the present invention which has the spectra of FIG. 6(b) symmetrically on both the front and rear ends of the waveguide.
Figure 6B:
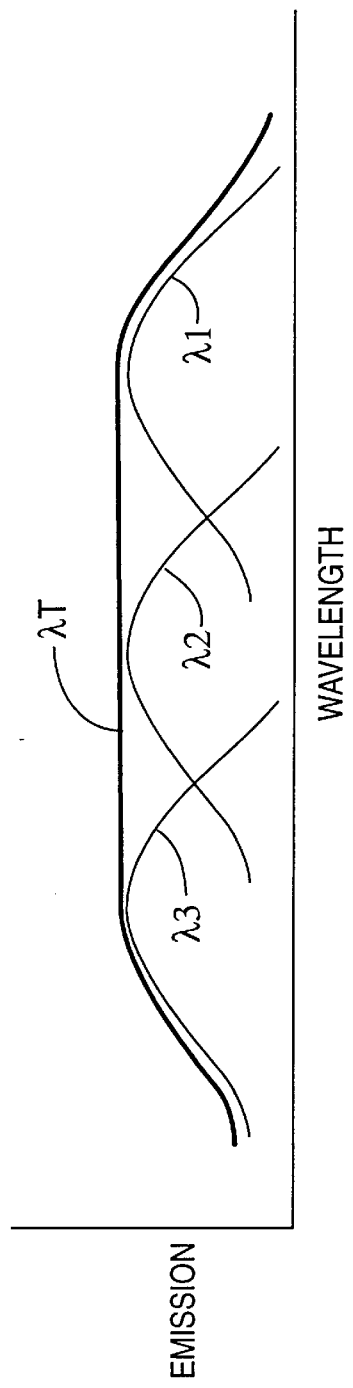

The approach of FIG. 5(a) can be used to obtain a waveguide having broader spectra by increasing the number of layers of materials having differing wavelengths, as shown in FIG. 6(a). A waveguide 210 has a layer 215 having material with the largest center wavelength Δλ1 in the center, the layers 220 having material with an intermediate wavelength λ2 closer to the facets a and b, and the layers 225 having material with the shortest wavelength λ3 nearest to the facets a and b, as shown in FIG. 6(a). The layers 215, 220, 225 are the active layers of the waveguide 210 and are sandwiched between an n-cladding layer 230 and a p-cladding layer 235. Preferably, the length of the center material 215 is twice that of each of the side layers; i.e., $L_{\lambda 1}=2L_{\lambda 2}=2L_{\lambda 3}$. The resultant output spectrum Δλ from each end of the waveguide 210 is shown in FIG. 6(b) and comprises the sum of the spectra of the materials, or Δλ=Δλ1+Δλ2+Δλ3. Thus, a waveguide having a broadened output spectrum that is symmetrical is obtained.

Broad band amplifiers of the type described herein are extremely useful for WDM (wavelength division multiplex) applications where a large number of independent channels (wavelengths) are to be carried by a single fiber. The ability to broaden the spectrum of the amplifier increases system capacity.

Although illustrated and described herein with reference to certain specific embodiments, the present invention is nevertheless not intended to be limited to the details shown. Rather, various modifications may be made in the details within the scope and range of equivalents of the claims and without departing from the invention. Thus, other semiconductor materials or other compositions of the chosen semiconductor materials than those mentioned in the examples may be used.

Also, the conductivity types may all be (simultaneously) replaced by their opposites. Apart from the manufacturing methods given here, variants to these methods are also available to those skilled in the art, while also other techniques, for example for providing the semiconductor layers, may advantageously be used.

What is claimed is:

1. A superluminescent diode (SLD), comprising:
    (a) a waveguide having a length defined by an optical beam path, the optical beam path being located between, and parallel to, a first cladding layer and a second cladding layer, the optical beam path including
        (i) a first emission layer having a first material with a light-emission wavelength and a spectral width; and
        (ii) a second emission layer having a second material different from the first material, the second material having a light-emission wavelength different from the light-emission wavelength of the first material, and having a spectral width, said second emission layer being disposed along the length of the waveguide, and in the optical beam path with said first emission layer.

2. The SLD of claim 1, wherein said first emission material is in contact with said second emission material.

3. The SLD of claim 1, wherein said first emission material is physically separated from said second emission material by said first cladding material.

4. The SLD of claim 2, further comprising:
    (e) a third emission layer having the light emission wavelength of the second material, wherein said first emission layer is disposed between said second emission layer and said third emission layer such that said third emission layer is disposed along the length of the waveguide, and in the optical beam path with said first emission layer and said second emission layer; and the light-emission wavelength of the second material is smaller than the light-emission wavelength of the first material.

5. The SLD of claim 3, further comprising:
(e) a third emission layer having the light emission wavelength of the second material; and wherein said first emission layer is disposed along the length of the waveguide, and in the optical beam path with said second emission layer and said third emission layer;
and wherein the light-emission wavelength of the second material is smaller than the light-emission wavelength of the first material.

6. The SLD of claim 1, wherein the first material comprises $Al_xGa_{1-x}As$, and wherein the second material comprises $Al_yGa_{1-y}As$, where x does not equal y.

7. The SLD of claim 2, wherein the first material comprises $Al_xGa_{1-x}As$, and wherein the second material comprises $Al_yGa_{1-y}As$, where x does not equal y.

8. The SLD of claim 3, wherein the first material comprises $Al_xGa_{1-x}As$, and wherein the second material comprises $Al_yGa_{1-y}As$, where x does not equal y.

* * * * *